(12) United States Patent
Blom et al.

(10) Patent No.: US 9,246,117 B2
(45) Date of Patent: Jan. 26, 2016

(54) MODULATABLE LIGHT-EMITTING DIODE

(75) Inventors: Paulus Wilhelmus Maria Blom, Valkenswaard (NL); Bert De Boer, Zevenhuizen (NL); Sandra De Boer-Douwsma, legal representative, Zevenhuizen (NL); Kamal Asadi, Eindhoven (NL)

(73) Assignees: Nederlandse Organisatie voor toegepast-natuurwetenschappelijk onderzoek TNO, Delft (NL); IMEC vzw, Leuven (BE)

( * ) Notice: Subject to any disclaimer, the term of this patent is extended or adjusted under 35 U.S.C. 154(b) by 1051 days.

(21) Appl. No.: 13/130,899

(22) PCT Filed: Nov. 26, 2009

(86) PCT No.: PCT/NL2009/050721
§ 371 (c)(1),
(2), (4) Date: Feb. 9, 2012

(87) PCT Pub. No.: WO2010/062178
PCT Pub. Date: Jun. 3, 2010

(65) Prior Publication Data
US 2012/0126704 A1    May 24, 2012

(30) Foreign Application Priority Data

Nov. 26, 2008 (EP) .................................. 08170025

(51) Int. Cl.
*H05B 33/04* (2006.01)
*H01L 51/50* (2006.01)
(Continued)

(52) U.S. Cl.
CPC ........ *H01L 51/5012* (2013.01); *H01L 27/3281* (2013.01); *H01L 51/52* (2013.01); *H05B 33/12* (2013.01)

(58) Field of Classification Search
USPC ......... 313/504, 507, 506, 509, 512, 503, 502, 313/498
See application file for complete search history.

(56) References Cited

U.S. PATENT DOCUMENTS 8,686,928 B2 * 4/2014 Tanada ............................. 345/81
2005/0007517 A1 * 1/2005 Anandan ......................... 349/69
(Continued)

FOREIGN PATENT DOCUMENTS

EP         1995736        11/2008

OTHER PUBLICATIONS

International Search Report, Application No. PCT/NL2009/050721, mailed Mar. 26, 2010.
(Continued)

*Primary Examiner* — Tuyet Vo
(74) *Attorney, Agent, or Firm* — Renner, Otto, Boisselle & Sklar, LLP

(57) ABSTRACT

Described is an (organic) light-emitting diode ((O)LED) wherein the light-emitting layer comprises a blend of an electroluminescent semiconducting material with a ferro-electric material. Either of the electrodes forms a modulatable injection barrier with the ferro-electric material, the modulation requiring a voltage $V_m$ serving to polarize or repolarize the ferro-electric material. With $V_m$ being larger than the voltage $V_e$ required for light emission, the (O)LED can be turned "on" or "off" by applying a pulse voltage to (re)polarize the ferro-electric material.

7 Claims, 2 Drawing Sheets

(51) Int. Cl.
*H05B 33/12* (2006.01)
*H01L 27/32* (2006.01)
*H01L 51/52* (2006.01)

(56) References Cited

U.S. PATENT DOCUMENTS

2009/0306368 A1   12/2009   Sugiyama et al.

2013/0027622 A1*   1/2013   Ishitani et al. .................. 349/42

OTHER PUBLICATIONS

Asadi et al.; "Organic non-volatile memories from ferroelectric phase-separated blends"; Nature Materials, Nature Publishing Group, vol. 7, No. 7, Jun. 15, 2008, pp. 547-550.

* cited by examiner

FIG. 1
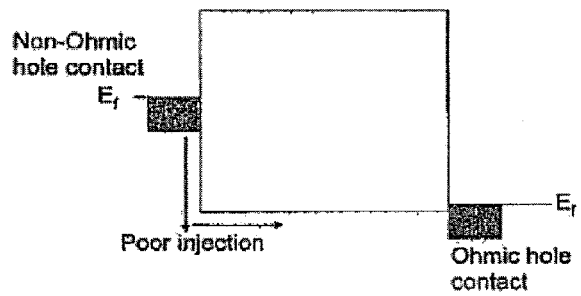
FIG. 2A
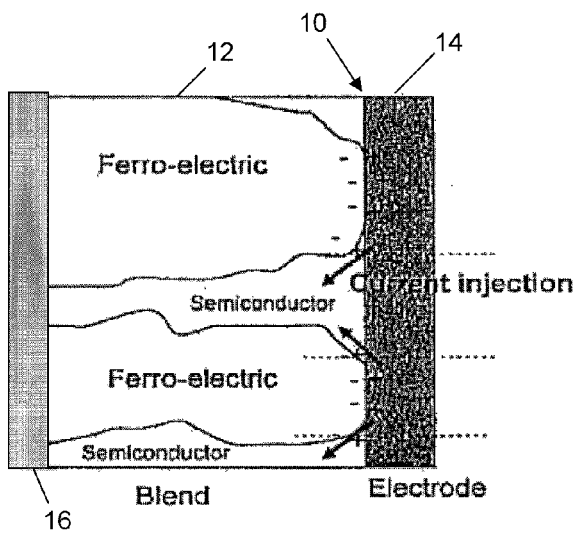
FIG. 2B
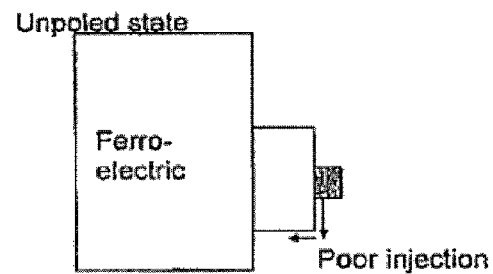
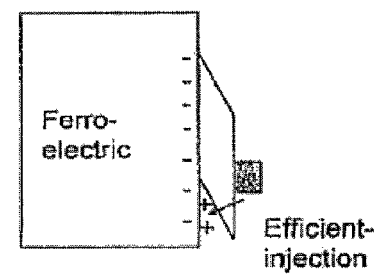
FIG. 2C

FIG. 3A
FIG. 3B
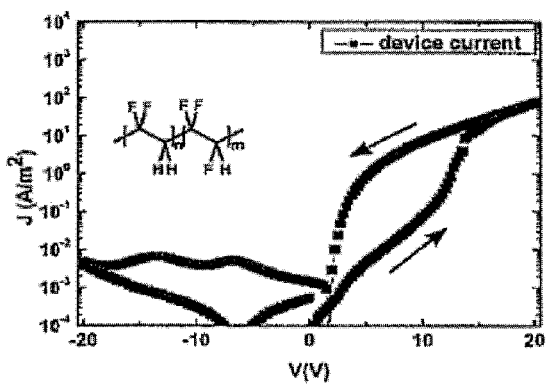
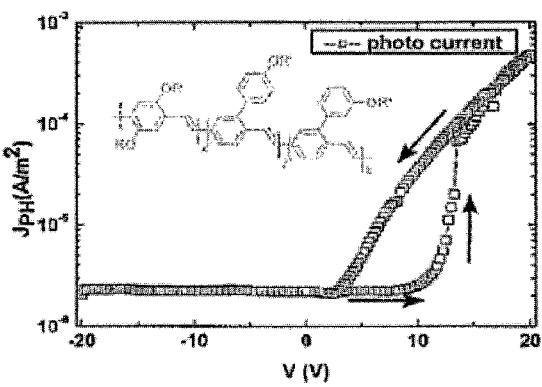
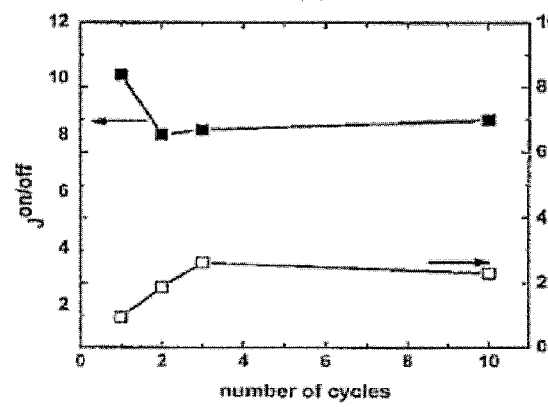
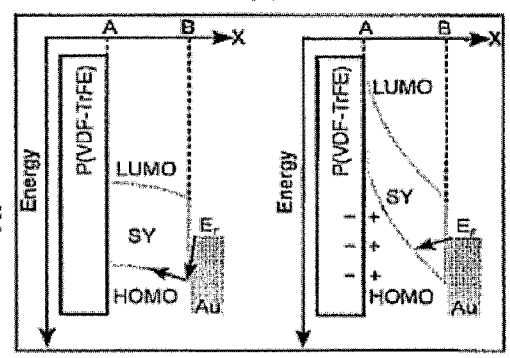
FIG. 3C
FIG. 3D

MODULATABLE LIGHT-EMITTING DIODE

FIELD OF THE INVENTION

The invention is in the field of light-emitting diodes (LEDs), particularly organic light-emitting diodes (OLED)s, and further relates to devices comprising modulatable (O)LEDs, particularly a modulatable LED-based display. The invention also relates to the use of a modulatable injection barrier for the addressing of an (O)LED.

BACKGROUND TO THE INVENTION

Light emitting diodes (LEDs), including organic light-emitting diodes (OLEDs) such as polymer OLEDs (PLEDs), small-molecule OLEDs (SMOLEDs) and light emitting electrochemical cells (LEEC), are proposed for several different lighting applications, such as for providing ambient light and as light sources in flat panel displays and signage.

One important category is visual signal application, where the light goes more or less directly from the LED to the human eye, to convey a message or meaning. This typically holds for use in displays and signage, such as electronic billboards, dynamic decorative displays, and thin, lighweight message displays at e.g. airports and railway stations, and as destination displays for e.g. trains, buses, trams, and ferries.

In an OLED, electrons and holes are injected into a layer of electroluminescent semiconducting material where they combine to generate excitons that undergo radiative decay. Holes are injected from the anode into the highest occupied molecular orbital (HOMO) of the electroluminescent material; electrons are injected from the cathode into the lowest unoccupied molecular orbital (LUMO) of the electroluminescent material OLED devices typically comprise a substrate supporting an anode layer, a cathode layer, and a light emitting layer comprising at least one organic or polymeric electroluminescent compound. The light emitting layer is normally sandwiched between the anode and the cathode. The cathode serves to inject negative charge carriers (electrons) and the anode serves to inject positive charge carriers (holes) into the organic layer.

For displays the device normally is patterned into a plurality of independently addressable domains (hereinafter referred to as pixels). Other layers may be present to enhance the OLED performance. For example, insertion of hole and/or electron injection and transport layer(s) is known to result in improved performance of several types of organic OLEDs.

Thus, a typical OLED comprises two organic layers sandwiched between two conductive electrodes. Counting from the anode, the first of the organic layers is responsible for hole transport and the second layer is responsible for the light generation. Electrons injected by the cathode and holes injected from the anode recombine in the light emitting layer, resulting in an exciton that decays radiatively in producing a photon. The color of the emitted light may be tuned by varying the band-gap of the emissive material used.

OLEDs find particular usage in flat panel and/or flexible displays. An advantage of OLED-based displays, as compared to Liquid Crystal Displays (LCDs) is that they avoid the need for backlight, which makes LCDs high energy consumptive.

In order to address the individual domains several schemes are possible: Passive matrix displays comprise a cross bar array of electrodes, via which each LED-based pixel can be addressed by applying a sufficiently high voltage to the pixels selected, and a relatively low voltage to the unselected pixels. This technology can be applied only in case of a limited number of pixels, and is therewith limited to displays of relatively small size and/or low resolution.

In active matrix displays, the diodes are addressed by providing each pixel with a field-effect transistor, which works as a switch to turn the pixel on or off, dependent on the gate voltage. Although this technology does not lead to the size limitations of a passive matrix display, it is a relatively expensive solution, and increasingly so with the size of the display.

Particularly for signage applications (large outdoor displays serving purposes of information and/or advertisements) the transistor technology is commercially unattractive.

Further, in respect of both of the foregoing types of displays, it would be desired to reduce or avoid the constant electrical energy to not only switch the pixels, but also to keep them in the desired state.

SUMMARY OF THE INVENTION

In order to better address one or more of the foregoing desires the invention, in one aspect, provides a light-emitting diode (LED), particularly an organic light-emitting diode (OLED) comprising
(a) an anode electrode layer;
(b) a cathode electrode layer; and, in contact with said electrode layers,
(c) a light-emitting layer, which separates the electrode layers from each other, comprising (d) an electroluminescent semiconducting material, wherein the light-emitting layer comprises a blend of the electroluminescent semiconducting material with (e) a ferro-electric material, and wherein either or both of the electrodes forms a modulatable injection barrier with the ferro-electric material, the modulation requiring a voltage $V_m$, and wherein $V_m$ is larger than the voltage $V_e$ required for light emission.

In another aspect, the invention provides a passive matrix display comprising a plurality of LEDs of the aforementioned type.

In a further aspect, the invention provides the use of the foregoing display in signage applications.

DETAILED DESCRIPTION OF THE INVENTION

The invention is applicable to LEDs based on inorganic and/or organic electro-luminescnet materials. Preferably, the invention pertains to organic light-emitting diodes (OLEDs). The term "organic light-emitting diode" (OLED) as used in this description includes both small organic molecule OLEDs and polymeric OLEDs. This means that the material in the OLED that is capable of emitting light, is an organic or polymeric semiconductor material that, upon application of a proper voltage, will emit light. In short, this is referred to as a light-emitting material.

In the invention, the light-emitting organic (polymeric) semiconductor material present in the light-emitting layer of such an OLED, is blended with a ferro-electric material, preferably an organic or polymeric ferro-electric material.

The blend thus comprises a ferro-electric phase and a light-emitting semiconductor phase. The invention allows both the semiconducting properties and the ferro-electric properties to be retained and optimised in one and the same device.

In effect, the invention herewith provides a modulatable injection barrier between an electrode layer and the light-emitting layer.

The term "injection barrier" is known to the skilled person, and relates to the energy step or energy barrier that carriers (electrons or holes) have to overcome when being injected from an electrode into a semiconductor material at their interface.

The term "modulatable" refers to an injection barrier of which the required energy step for charge injection can be switched from a low to a high level. For a high energy barrier only few charge carriers can be injected into the semiconductor(low-conducting state), whereas for a low barrier a large amount of carriers can be injected, leading to a large current (conductive state).

To provide the modulatable injection barrier, according to the invention, the light-emitting layer comprises a blend of an electro-luminescent semiconductor material and a ferro-electric material. Without theory to be considered as binding, it is believed that poling of the ferro-electric material, when in contact with the electrode, will allow carrier injection into the light-emitting semiconductor material, in other words, will allow current to flow into the light-emitting semiconductor material, in direct or indirect contact with the same electrode.

The OLED of the invention operates as follows.

The ferro-electric material can be in a poled (positively or negatively) or unpoled state. Changing from one state to the other requires the application of a modulation voltage $V_m$. The application of voltages below $V_m$ (a lower potential) will not change the state of the ferro-electric material.

The ferro-electric material modulates the charge injection from either one of the electrodes into the semiconductor. This means that in the unpoled state of the ferro-electric the semiconductor will form a "bad" contact with the electrode. By "bad contact" it is meant that the injection barrier between the electrode and the semiconductor is too large to inject charge carriers. For a light-emitting semiconductor this means that if the ferro-electric material is in a non-polarized state, the charge carriers' injection into the light-emitting semiconductor will be insufficient for the electro-luminescent material to switch "on" and emit light at sufficient brightness.

If a voltage of at least $V_m$ is applied, i.e. sufficient to polarize the ferro-electric material, with the right sign this will result in a change from a "bad" contact into a "good" contact. Then, the contact between the electrode and the blend of the semiconductor and the poled ferro-electric material leads to efficient injection of charge carriers into the semiconductor (holes in case of the anode, electrons in case of the cathode). By virtue of the presence of the electroluminescent material in a blend with the ferro-electric material, the "good" contact will lead to efficient charge carriers' injection into the electroluminescent semiconductor. Provided that the work function of the electrode, in the situation of a poled ferro-electric material, is sufficiently high to address the electroluminescent semiconducting material, the latter will effectively be in the "on" state and emit light.

The electroluminescent semiconductor material, by being blended with the ferro-electric material, thus has become intrinsically modulatable. As a result, in comparison with an active matrix display, pixels comprising the modulatable OLED of the invention can be switched "on" and "off" without the use of a transistor. On the other hand, in comparison with a passive matrix display, the pixels can be switched "on" and "off" with a single voltage pulse rather than requiring a constant operating voltage to address the "on" pixels. I.e., after the pulse a state is reached that is permanent until the next switching voltage pulse.

The OLED can thus be switched from one binary state to the other through polarization of the ferro-electric, applying a pulse of a relatively high first voltage $V_m$. As long as the voltage $V_e$ that is applied so as to secure injection of charge carriers into the electro-luminescent material (holes into the HOMO and electrons into the LUMO) is insufficient to re-polarize or de-polarize the ferro-electric, the device is intrinsically non-volatile. I.e. a pixel, once "on", will stay "on" until a pulse $V_m$ is applied that changes the polarization direction of the ferro-electric material.

Vice versa, a pixel, once "off", will stay "off" until a pulse $V_m$ is applied that polarizes the ferro-electric material again in the right direction.

The modulatable injection barrier of the invention thus allows, e.g., a "good" contact (i.e. an electrode-semiconductor interphase at which current readily flows) to be transformed into a "bad" contact (i.e. an interphase at which current-flow is low or zero), or vice versa. The skilled reader will understand that variants between "good" and "bad" contacts are possible.

The various elements of the present invention are discussed hereinbelow.

The light-emitting layer, in its simplest form, is one layer comprising a blend of an organic electro-luminescent semiconducting material and a ferro-electric material. Although either or both of the electro-luminescent material and the ferro-electric material can be inorganic, it is preferred to select an organic or polymeric electro-luminescent material, and it is further preferred to also select an organic or polymeric ferro-electric material.

Suitable inorganic ferro-electric materials include $PbTiO_3$, $BiTiO_3$, and the like.

Suitable organic ferro-electric materials are nylons and most preferably poly vinylidene fluoride co polymers with trifluoroethylene (P(VDF-TrFE)). Materials can be either high- or low molecular weight as long as they are ferroelectric. Also electrets can be used in stead of ferro-electric materials because their polarization can be switched using an applied electric field.

Generally any electro-luminescent material, preferably an organic electro-luminescent material can be used. These materials are well-known to the skilled person, such as aluminium gallium arsenide for red light, gallium arsenide phosphide for orange or yellow, aluminium gallium indium phosphide for green, indium gallium nitride fro blue, or violet, and many others (the materials mentioned are just examples). For preferred examples of organic electro-luminescent materials, reference is made to WO 90/13148, EP 0 880 303, WO 2005/17065, U.S. Pat. No. 4,539,507. It will be understood that the exact organic electro-luminescent material selected, will depend int. al. on the desired color of the emitted light, as the choice of the material will determine said color. Non-polymeric organic electro-luminescent materials are preferably comprised in a carrier polymer, as is customary for these materials. Polymeric electro-luminescent materials are generally used as such.

Preferred electro-luminescent semiconductive materials are poly(p-phenylene vinylene) polymers (PPV) and polyfluorene polymers.

In some circumstances it may also be appropriate to form polymer blends of an electro-luminescent semiconductive polymer with other polymers so as to obtain the required processibility of the polymer and thereby facilitate forming of the required thin uniform films of the polymer on the conducting substrate (the charge injecting contact layer).

When such copolymers or polymer blends are used to form the film of conjugated polymer, the active region of the electroluminescent device which incorporates the said film of conjugated polymer must contain a volume fraction of electro-luminescent semiconductive polymer which is greater than or equal to the percolation threshold of the copolymer or polymer blend.

The semiconductor electroluminescent layer may be formed as a composite layer with layers of polymers with different band gaps and/or majority charge species so that, for example, concentration of the injected charge, from the charge injecting contact layer, within a particular region of the OLED device may be achieved. Composite layers may be fabricated by successive deposition of polymer layers. In the case where films are deposited in the form of the precursor by spin- or draw-coating to the conjugated polymer, the conversion process to the conjugated polymer renders the film insoluble, so that subsequent layers may be similarly applied without dissolution of the previously deposited film.

It should be noted that the term "blend" has a broad meaning, indicating true blends of polymers, copolymers, or interpenetrating polymer networks (IPNs) of such a type as to still comprise separate phases of the semiconductor polymer and the ferro-electric polymer.

In the blend, the ferro-electric polymer is present in at least a sufficient extent to allow that a polarization charge can be measured (i.e. otherwise the material would no longer be a ferro-electric). The semiconductor polymer is present in an amount at least sufficient to allow a path through the blend for travel of a charge carrier between the electrodes.

More particularly, the electro-luminescent semiconductor material (d) and the ferro-electric material (e) can be blended in a ratio, by weight, of (d): e) ranging from 1:1 to 1000:1, preferably of from 10:1 to 100:1.

The electrodes (a) and (b) are regular components of light-emittng diodes and the like. The same electrode materials can be used which are well-known for semiconductor devices such as transistors, diodes, et cetera. Suitable materials include tungsten, silver, copper, titanium, chromium, cobalt, tantalum, germanium, gold, aluminum, magnesium, manganese, indium, iron, nickel, palladium, platinum, zinc, alloys of the foregoing metals, aluminum, lithium, sodium, barium, calcium, lithium fluoride, indium-tin oxide, other conductive and semi-conductive metal oxides, nitrides and silicides, polysilicon, doped amorphous silicon, and various metal composition alloys. Also, doped or undoped conducting or semi-conducting polymers, oligomers, and monomers can be used for the electrodes, such as poly(3,4-ethylenedioxythiophene): poly(styrene sulphonate) (PEDOT:PSS), polyaniline, polythiothene, polypyrrole, and derivatives thereof. Electrodes can comprise one or more layers of different materials, or blends from different materials.

It is noted that in conventional (organic) light-emitting devices, the contacts are always asymmetric: one electrode with a low work function (Ba, Ca etc.) is used to efficiently inject electrons. For injection of holes a high work function metal (Au, Pt), or polymer (PEDOT/PSS) can be used to efficiently inject holes. In the modulatable (O)LED of the invention, at least one electrode has to be 'bad', in the sense of providing a non-Ohmic contact. Thus, e.g. a good electron contact (Ba) can be combined with a bad hole contact (Ag). It is conceivable to employ non-Ohmic contacts for both electrodes, since the ferroelectric in principle is able to change them both from 'bad' into 'good' at the same time.

At any rate, at least one of the electrodes is a contact with a non-negligable injection barrier (i.e. a 'bad' contact), which can be modulated in accordance with the invention.

The cathode is selected in order that electrons are injected into the device and as such may comprise a single conductive material such as a layer of aluminium. Alternatively, it may comprise a plurality of metals, for example a bilayer of calcium and aluminium as disclosed in WO 98/10621, or a thin layer of dielectric material such as lithium fluoride to assist electron injection as disclosed in, for example, WO 00/48258.

Reactive materials such as barium or calcium, may affect the stability of the OLED. In this invention it is also contemplated to use a non-reactive contact, e.g. aluminium, which by itself is not a good injector of electrons. In conjunction with the ferro-electric, as foreseen in the invention, the electron injection from the non-reactive electrode is brought to a much higher level, as a non-reactive replacement of electrodes made of such reactive materials as calcium and barium. The anode typically comprises Indium Tin Oxide, other anode materials include gold, platina, palladium, or conducting polymers as PEDT/PSS.

It will be understood that the appropriate combination of electrodes and organic electro-luminescent semiconductive material needs to be chosen. The selection of electrodes can be easily accomplished by the skilled person with reference to existing knowledge of electrode materials and their work functions, e.g. to be found in Physics of Semiconductor Devices, 2nd. edition, by. S. M. Sze, Chapter 5, p. 251.

The aforementioned layers are preferably applied onto a substrate. The substrate of the device preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0 949 850.

The electrodes are applied in a practical order, preferably as most logically going with building up the device on a substrate. Thus, the first electrode layer (a) is applied on a substrate, e.g. by evaporation. As a next layer, the active (light-emitting) layer is applied comprising a blend as described above. In making the device, a practical advantage is obtained by choosing polymer materials for the blend, as these can be applied with relative ease, and in desired thicknesses, by techniques known in the art of organic and polymer devices, such as spin-coating or printing.

Before further processing, the active (light-emitting) layer may or may not desire, or require, a further treatment, e.g. annealing a polymer blend as known for ferro-electric polymers. The ferro-electric properties are enhanced when these polymers are crystallized above the Curie temperature.

In the specific embodiment described, with a substrate on which the first electrode layer (a) and the active layer (c) are consecutively applied, on top of the active/blend/light-emitting layer the second electrode (b) is applied, which can be done in the same fashion as discussed for the first electrode layer (a).

While the devices according to the invention can be built-up each individually, it is preferred to create the layer structure of the invention for a plurality of devices simultaneously. To this end either or both of the electrode layers can be provided with shapes commensurate with any desired circuitry in which the light-emitting devices of the invention are used. Preferably, the device is built up so as to have crossing bars of electrodes. In order to prevent cross-talk between the devices it is important that in both the high and low conductance state the current in reverse bias is low.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142.

In a practical OLED, at least one of the electrodes is semi-transparent in order that light may be emitted. Where the anode is transparent, it typically comprises indium tin oxide. Examples of transparent cathodes are disclosed in, for example, GB 2348316.

Although, as other OLEDs, the OLED of the invention could be used in a static image device, i.e. a device that displays only a single image, it will be understood that the advantages of the invention are mostly enjoyed in a variable image device, i.e. a device wherein different areas of the light-emitting layer may be independently addressed.

As mentioned above, the invention particularly provides for a passive matrix device that has the advantage of comprising intrinsically modulatable pixels. These devices include displays for computers, television sets, and particularly large displays such as used for advertisement screens, information screens, and other application that collectively are known as "signage" applications.

Herein the OLED of the invention has several advantages: each pixel can simply be switched by means of an electrical pulse, as explained above. The set-up of a mutiple pixel device can be with crossed bars of electrodes, through which each pixel can be individually selected by combined selection in rows and columns of these electrodes. This way of addressing the pixels can be viewed as combining the advantages of an active matrix display in modulating the pixels and in the number of pixels that the device can contain, with the advantages of the relatively simple set-up of a passive matrix. Added to this is (apart from the voltages to obtain light emission) the advantage of pulse modulation voltages instead of continuous voltages as explained above, and—in comparison with the transistors required in an active marix display—the avoidance of an additional component that has to be integrated and strongly contributes to expenses.

The light-emitting layer can be a single layer comprising the blended semiconductor and ferro-electric phases. It can also comprise several sublayers of the same blend, or several sublayers of different blends.

The light-emitting layer typically has a thickness of 50-500 nm and preferably about 100 nm.

Either or both of the ferro-electric and the electro-luminescent materials are organic or inorganic materials. It is preferred that at least one of the two is an organic material. Then it is also possible to provide, in the light-emitting layer, a continuous first phase of an organic material having either of the electro-luminescent semiconductor or ferro-electric properties, and contained in this, the second phase of an inorganic material having the other of the electro-luminescent semiconductor or ferro-electric properties. Most preferably both of the active materials in the blend (i.e. the ferro-electric material as well as the electro-luminescent material) are organic materials, preferably polymeric materials.

As an example a ferro-electric can be prepatterned with nanometer sized holes that are filled with an (in)organic semiconductor.

The processing is facilitated using a common solvent for both ferro-electric and semiconductor to obtain an intimate morphology. For better processability, it may be preferred to apply the solution of either or both of the active materials at elevated temperature. This refers to a temperature above ambient temperature (e.g. 30° C. or higher) and obviously will be below the degradation temperature of the ferro-electric and/or electro-luminescent materials (which will vary with the material, and will be known to the skilled person). Alternatively, or additionally, the temperature of the substrate can be varied, e.g. elevated so as to aid in processability of the applied layer, or lowered in order to avoid flowing of the actives directly after application. Furthermore, addition of compatibilizers can be helpful as commonly used in blends of two polymers.

In order to change the switching characteristics additional semiconductor layers can be added between the active (blend) layer and electrodes. Particularly at the electrode other than the one used for modulating the charge carriers' injection into the active (blend) layer, one has freedom to add additional layers. E.g. if the cathode is used for modulation, an additional layer customary in the art can be applied on the anode, such as a layer of organic hole injection material that assists the hole injection from the anode into the light-emitting (blend) layer. Examples of organic hole injection materials include PEDT/PSS as disclosed in EP 0901176 and EP 0947123, or polyaniline as disclosed in U.S. Pat. Nos. 5,723, 873 and 5,798,170.

By virtue of the (O)LEDs according to the invention, an essentially new type of display based on (O)LED technology can be provided. This can be summarized as a display combining the simplicity of a passive matrix display with the functionality (viz. modulatable pixels) of an active matrix display. In view of the avoidance of transistors to modulate pixels, the displays of the invention are herewith referred to as non-volatile passive matrix displays.

The displays of the invention are particularly advantageous in applications were large sizes and, and notably in applications were costs are a limiting factor. This makes the (O)LEDs of the invention particularly useful for applications in which switching (modulation) of pixels is needed, yet less frequently than in the case of e.g. a television display. Thus, in signage applications the benefits of the invention can be enjoyed most. This also involves the advantage that an image generated by means of modulation of (O)LEDs according to the invention is essentially non-volatile. Yet, it will be understood that the advantage of a non-volatile image is essentially combined with the advantage that the image can be locally re-written (modified) by simply switching the required pixels as desired. This has been explained above, with reference to the need of an electrical pulse to change the polarization of the ferro-electric material in the blend.

Typical signage applications include information displays such as above roads or in railroad stations, depicting text that needs to be changeable. It also includes advertisement billboards on which a variety of static pictures is shown consecutively, but in which any of these pictures may also involve motion (i.e. not a static image but a motion picture).

For these large (and large-scale) applications, it is an additional advantage that the use of electricity during static phases is limited to the relatively low voltages needed to operate the LEDs, and that higher voltages needed to address pixels are only needed temporarily, i.e. as pulses. Although the invention has particular benefits in signage displays of a relatively large scale (e.g. of the order of magnitude of several square meters), the non-volatile passive matrix displays of the invention can also be used in relative small-size signage displays, e.g. indication screens in automobiles, which are usually of an order of magnitude of several square centimeters. In the latter case, pixels are typically of the order of a millimeter, whilst in the aforementioned large displays the pixels typically are equally enlarged, viz. of the order of magnitude of one to several centimeters.

In view of the foregoing, it will be apparent that the modulatable LEDs of the invention make it possible to provide a new type of LED-based display, viz. a non-volatile passive matrix display. The modulatable LEDs of the invention also enable a novel and convenient method of operating and switching light-emission. In this respect, the invention also pertains to the use of a light-emitting diode as described hereinbefore, in an electronic device capable of applying a voltage over the electrode layers, wherein a voltage $V_e$ is applied so as to operate the diode, and a voltage pulse $V_m$ is applied so as to switch the diode, wherein the operating voltage $V_e$ is below the required switching voltage $V_m$.

It should be noted that electronic devices, and constructions allowing the application of voltages over components contained in such devices, are fully known to the skilled person and do not require elucidation here. The same holds for the construction of displays. I.e. once apprised of the non-volatile passive matrix technology enabled by the modulatable LEDs of the invention described hereinbefore, the skilled person will have no difficulty to use common general knowledge in constructing a working display on the basis thereof.

In one embodiment of the present invention, a display comprises a plurality of row driver (cathode), and a plurality of column drivers (anode) forming a crossbar array. The row driver and the column driver are operable to apply different sets of drive voltages to the LED during a first phase and a second phase of an addressing period for the pixel. In the first phase the LED is programmed to a desired state in response to a row drive voltage and a column drive voltage being applied to the diode during a beginning phase of the addressing period for the pixel (P). The LED is set to either a light emitting or a non-emitting state. This state is retained in the second phase. In response to a different row drive voltage and a column drive voltage being applied to the diode the pixel is now emitting light or not. In the next addressing method, the LED can be programmed to the same or to the other state.

The foregoing embodiment of this invention as well as other embodiments of the present inventions as well as various features and advantages of the present invention will become further apparent below where we discuss the addressing scheme of a normal passive matrix display.

A display of the present invention resembles most a so-called passive matrix LED display. Such a display is arguable the simplest to make, and therefore can be made at low cost. In a passive matrix OLED display, the image is built up in much the same manner as in a traditional television tube. Each line of the image is written sequentially and flashes very bright for a very short time. This is achieved by holding all LEDs in reverse bias other than the line being addressed, which is set to a lower voltage. Due to the diode characteristic, it is possible to multiplex a LED display as much as is desired without diminishing the image quality. By scanning the lines sufficiently quickly (to make up about 60 pictures per second), the eye will integrate all the light flashes into a nice picture, as occurs when we watch traditional CRT based TV.

The problem with this method of building up a picture is that in order to obtain normal picture brightness, the light pulses have to be extremely bright because they are only present for a short time. In a 100-line display, for example, the light pulses have to flash with a peak luminance that is 100 times the average luminance that is 100 times the average luminance one actually perceives. This means that high currents and voltages are needed for the light pulses, which in turn causes a great deal of power to be dissipated in the electrodes of the displays. Since this power is not used to produce light, the display efficiency falls dramatically. The power dissipation and the high peak brightness will limit the lifetime of the display.

There are various approaches to reduce the power dissipation:
  increasing the LED efficiency
  lowering the resistances of the row and column electrodes.
  Adding more driver ICs
  Active matrix addressing (TFT backplane).

Approach 3 and 4 add significant cost to the display. Approach 1 and 2 can be followed independently and will reduce the power consumption but there will be a point at which the step to a bigger display becomes impractable. At that point, it will be necessary to move away from the line-at-the-time pulsed light emission of a passive matrix to a technique in which all of the display emits light continuously. This can be achieved by adding extra electronics. Active-matrix displays differ from the aforementioned displays in that they have a switch incorporated in each pixel. This removes the limitations encountered in passive matrix displays, but requires more sophisticated processing equipment to be used. The circuitry must perform two functions. It must provide a controlled current source to drive the LED and also provide some storage to enable the pixel to continue providing current after the addressing period.

It will be understood that the LED of the present invention has the apparent advantage that it allows display driving in which the pixel emits continuously (in the second phase), peak drive currents are reduced, as are the associated voltage drops along the rows and columns. This means that large displays can be made with lower power losses than the normal passive matrix displays, without adding extra cost. Grey levels can be achieved by pulse width modulation.

A display which comprises a plurality of anode electrodes and a plurality of cathode electrodes, thus forming a cross-bar matrix, and a light emitting layer which separates the anode from the cathode. The crossover of anode and cathode forms the pixel which has diode characteristics that can be modulated by applying appropriate voltages.

In the foregoing embodiment the invention presents a display wherein anode and cathode electrodes are operable to apply different drive voltages to the LED during a first phase and a second phase of an addressing period for the pixel; wherein the LED is operable to be set to a light emitting state or a non-emitting state during the beginning phase of the addressing period for the pixel; wherein the LED is further operable to emitting light (or not) in response to during the second phase in response to a different yet constant voltage difference. During phase 1 all rows and columns are scanned one-line-at the time. During phase 2 all rows are set to a constant voltage V1, all columns are set to a constant voltage V2 and in response of the voltage difference V1–V2 selected pixel elements emit light continuously during this phase.

It is to be understood that the invention is not limited to the embodiments and formulae as described hereinbefore. It is also to be understood that in the claims the word "comprising" does not exclude other elements or steps. Where an indefinite or definite article is used when referring to a singular noun e.g. "a" or "an", "the", this includes a plural of that noun unless something else is specifically stated.

The invention will be illustrated with reference to the following, unlimitative Examples and the accompanying Figures.

FIGURES

FIG. 1 shows a band diagram associated with a non-Ohmic contact (Fermi-level not aligned with the valence- or conduction band) and an Ohmic contact (Fermi-level aligned).

FIG. 2A shows a cross-section of a part of an injection barrier 10 applicable to the invention. In white, it depicts a light emitting layer 12 including a blend of semiconductor material (i.e. electro-luminescent semiconductor material) and ferro-electric material (indicated with words). In grey it depicts part of an anode electrode layer 14. A part of a cathode electrode layer 16 is also shown. As is shown, a poling of the ferro-electric material results at the boundary of the ferro-electric material and the anode electrode layer 14 in opposite charges (depicted as a negative charge (−) at the ferro-electric side and a positive charge (+) at the electrode side). The arrows pointing from the anode electrode layer 14 into the direction of the semiconductor material show (as also indicated in words) the injection of charge into the semiconductor material. The figure also contains dashed lines, to indicate the source for band diagrams as depicted in FIGS. 2B and 2C. FIGS. 2B and 2C show band diagrams as will be valid for the positions of the dashed lines drawn in FIG. 2A. The horizontal lines stand for the valence band (low) and the conduction band (high), of the ferro-electric on the left (with the larger band gap) and the semiconductor on the right (with the smaller band gap), grey being the anode electrode layer.

The band diagram shown in FIG. 2B is valid for the unpoled state of the ferro-electric. The arrows from the electrode into the direction of the ferro-electric, display the inadequacy of carriers to be injected into the semiconductor material (indicated as "poor injection").

The band diagram shown in FIG. 2C is valid for the poled state of the ferro-electric, i.e. the situation shown in FIG. 2A. The poling of the ferro-electric results in a sufficient countercharge at the electrode so as to surmount the energy barrier with the semiconductor material, allowing charge carriers to flow into same (indicated as "efficient injection").

FIG. 3A is a diagram in which the electrical current density in the modulatable LED of the below Example is plotted against the applied voltage. It is shown that a voltage sweep in one direction (here: negative voltages) leads to a negligable current density (which reflects a 'bad' contact) and a voltage sweep in the other direction (here: positive voltages) results in a high current density (which reflects a 'good' contact). I.e., upon voltage sweep of the device switching to efficient charge injection occurs at voltages higher than the coercive field of the ferroelectric (50-60 MV/m).

FIG. 3B shows a similar diagram for the electroluminescence of the device. Hardly any electroluminescence occurs at the above-mentioned negative voltages (i.e. the modulatable LED is "off"), whilst it does when the voltage in the right direction is high enough (i.e. the modulatable LED is "on"). Thus, switching from low- to high-brightness takes place if the electric field over the device is equal to the coercive field of the ferroelectric.

FIG. 3C shows that the on/off ratio in device characteristics is persistent after 10 times switching the modulatable LED on and off.

FIG. 3D represents the operation mechanism of the device, which is based on modulating the charge injection at the anode.

EXAMPLE

A modulatable LED according to the invention was made as follows.

A ferroelectric polymer, poly(vinildyne-co-triflouroethylene), P(VDF-TrFE) (65%-35%), and organic semiconductor super yellow (SY), a yellow emitting derivative of PPV, were co-dissolved in tetrahydrofuran (THF) with 1:3 ratio of SY:P (VDF-TrFE). The blend was spincoated onto a clean glass substrate with semitransparent gold anodes (15 nm) with 1 nm of chromium as adhesion layer. Subsequent annealing at 140° C. in a vacuum oven was conducted to enhance the crystallinity and ferro-electricity in the P(VDF-TrFE) phase. The resulting devices were finished with evaporation of barium (5-15 nm), capped with aluminium (100 nm) as a cathode, and characterized in nitrogen filled glove box.

In the resulting device, gold forms an injection limited contact with SY. The injection barrier is approximately 0.6-0.7 eV for hole charge carriers. Therefore the light emission of the device with gold anode is very weak, if at all detectable. Upon voltage sweep of the device, switching to efficient charge 15 injection occurs at voltages higher than the coercive field of the ferroelectric (50-60 MV/m), (FIG. 3A). The device performs now as an electrically bistable element. Switching from low- to high-brightness takes place when electric field over the device is equal to the coercive field of the ferroelectric. The low and high brightness can be designate as OLED in the off- and on-state, 20 respectively. The electroluminescence of the device during the voltage sweep shows hysteresis (FIG. 3B). Thus, the modulatable LED is non-volatile, i.e. it retains its previous emissive state upon removing the voltage over the device.

The invention claimed is:

1. Light-emitting diode comprising (a) an anode electrode layer; (b) a cathode electrode layer; and, in contact with said electrode layers, (c) a light emitting layer, which separates the electrode layers from each other, comprising (d) an electroluminescent semiconducting material, wherein the light-emitting layer comprises a blend of the electroluminescent semiconducting material with (e) a ferro-electric material, and wherein either or both of the electrodes forms a modulatable injection barrier with the ferroelectric material, the modulation requiring a voltage $V_m$, and wherein $V_m$ is larger than the voltage $V_e$ required for light emission.

2. Light-emitting diode according to claim 1, wherein the ferro-electric material comprises a poly vinylidene fluoride copolymer with trifluoroethylene.

3. A matrix display comprising a plurality of light-emitting diodes according to claim 1.

4. A method of using the light-emitting diode of claim 1, in an electronic device capable of applying a voltage over the electrode layers, comprising applying a voltage $V_e$ so as to operate the diode, and applying a voltage pulse $V_m$ so as to switch the diode, wherein the operating voltage $V_e$ is below the required switching voltage $V_m$.

5. Light emitting diode according to claim 1, wherein either or both of the electro-luminescent semiconducting material and the ferro-electric material are organic materials.

6. Light-emitting diode according to claim 5, wherein the electroluminescent semiconducting material comprises a polymeric material.

7. Light-emitting diode according to claim 6, wherein the polymeric material comprises a poly(p-phenylene vinylene) polymer or a polyfluorene polymer.

* * * * *